United States Patent
Cadag et al.

(10) Patent No.: US 9,324,643 B1
(45) Date of Patent: Apr. 26, 2016

(54) INTEGRATED CIRCUIT DEVICE HAVING EXPOSED CONTACT PADS AND LEADS SUPPORTING THE INTEGRATED CIRCUIT DIE AND METHOD OF FORMING THE DEVICE

(71) Applicant: STMICROELECTRONICS, INC., Calamba, Laguna (PH)

(72) Inventors: Ela Mia Cadag, Calamba (PH); Ricky Calustre, Batangas (PH)

(73) Assignee: STMICROELECTRONICS, INC., Calamba, Laguna (PH)

( * ) Notice: Subject to any disclaimer, the term of this patent is extended or adjusted under 35 U.S.C. 154(b) by 0 days.

(21) Appl. No.: 14/566,826

(22) Filed: Dec. 11, 2014

(51) Int. Cl.
*H01L 23/495* (2006.01)
*H01L 23/31* (2006.01)
*H01L 23/00* (2006.01)
*H01L 21/56* (2006.01)

(52) U.S. Cl.
CPC .......... *H01L 23/49541* (2013.01); *H01L 21/56* (2013.01); *H01L 23/3114* (2013.01); *H01L 23/49503* (2013.01); *H01L 24/49* (2013.01); *H01L 24/73* (2013.01); *H01L 24/85* (2013.01); *H01L 24/92* (2013.01); *H01L 2224/48106* (2013.01); *H01L 2224/48247* (2013.01); *H01L 2224/73265* (2013.01); *H01L 2224/92247* (2013.01); *H01L 2924/14* (2013.01)

(58) Field of Classification Search
USPC ........................................................ 257/666
See application file for complete search history.

(56) References Cited

U.S. PATENT DOCUMENTS

| | | | |
|---|---|---|---|
| 4,408,218 A | 10/1983 | Grabbe | |
| 4,445,271 A | 5/1984 | Grabbe | |
| 6,061,242 A | 5/2000 | Corisis et al. | |
| 6,162,662 A | 12/2000 | Corisis | |
| 6,359,221 B1* | 3/2002 | Yamada | H01L 21/4828 174/542 |
| 9,196,576 B2* | 11/2015 | Yow | H01L 23/49568 |
| 2004/0080025 A1* | 4/2004 | Kasahara | H01L 21/4821 257/666 |

* cited by examiner

*Primary Examiner* — Zandra Smith
*Assistant Examiner* — Lawrence Tynes, Jr.
(74) *Attorney, Agent, or Firm* — Allen, Dyer, Doppelt, Milbrath & Gilchrist, P.A.

(57) ABSTRACT

An integrated circuit (IC) device includes an IC die and encapsulation material surrounding the IC die. A first set of leads is coupled to the IC die and has first contact pads exposed on a bottom surface of the encapsulation material adjacent its periphery. A second set of leads is coupled to the IC die and has second contact pads exposed on the bottom surface of the encapsulation material adjacent its periphery. The second set of leads has internal ends extending laterally inwardly from respective ones of the second contact pads to define a die pad area supporting the IC die.

15 Claims, 5 Drawing Sheets

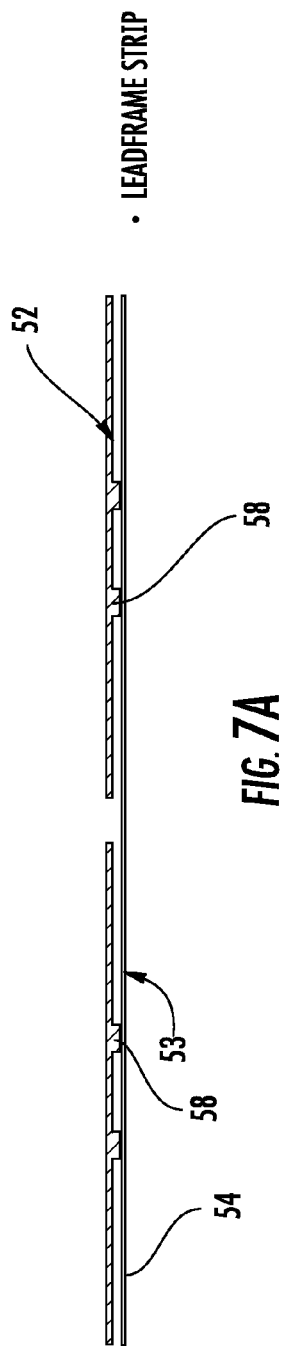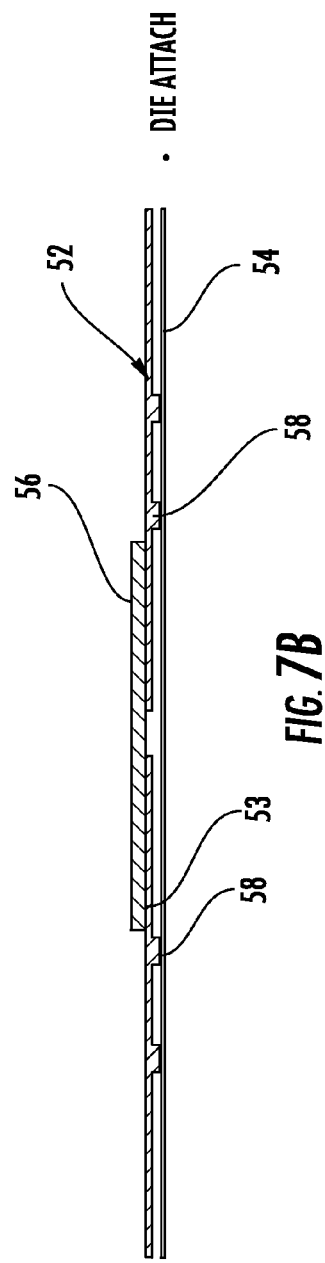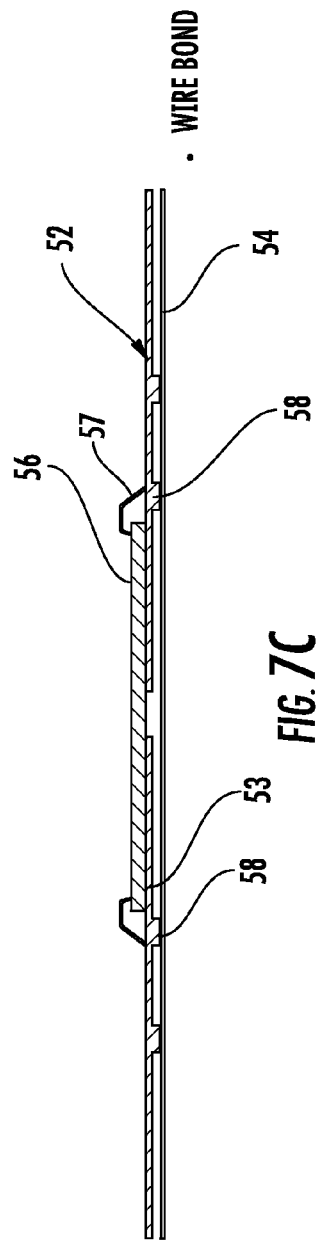

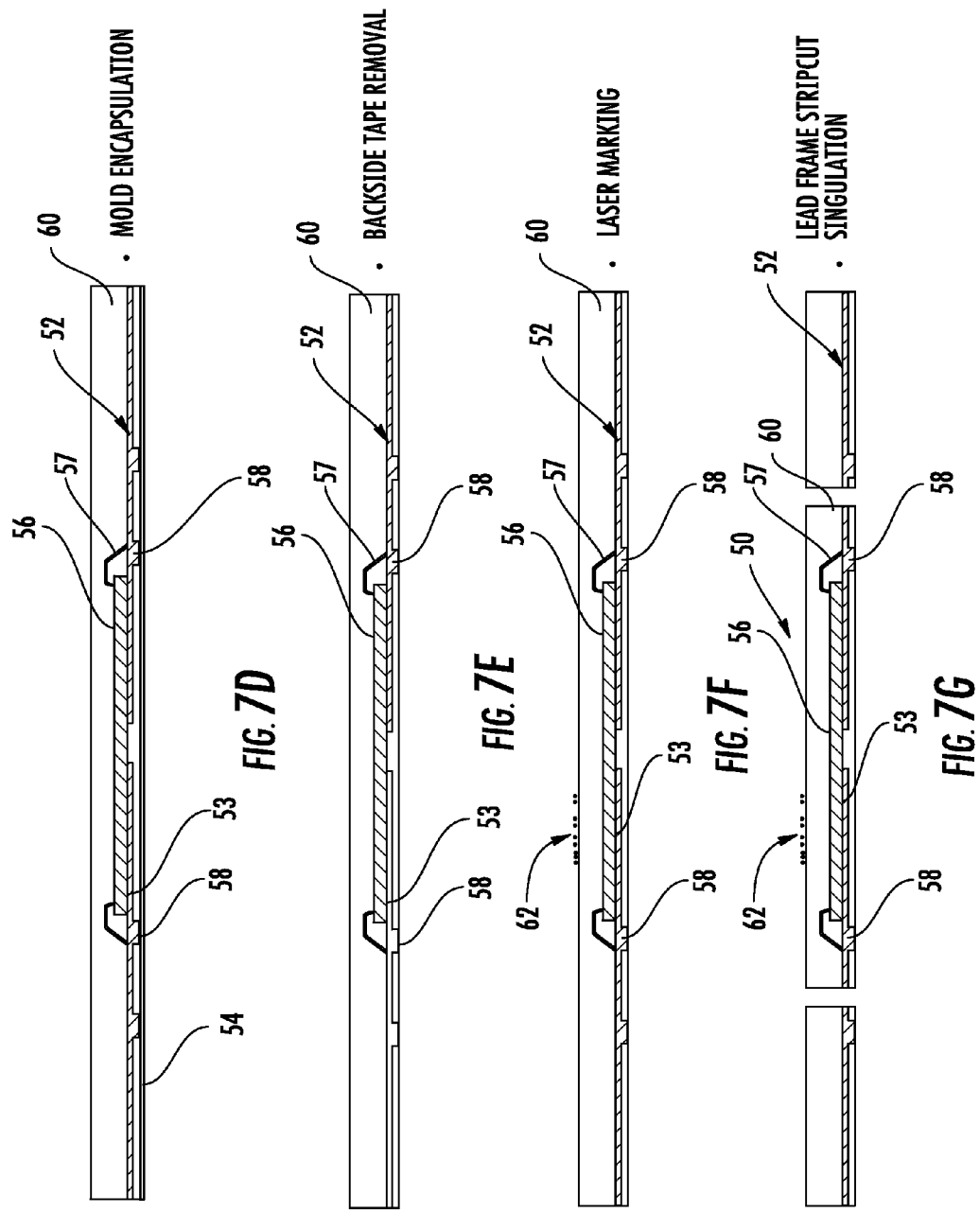

INTEGRATED CIRCUIT DEVICE HAVING EXPOSED CONTACT PADS AND LEADS SUPPORTING THE INTEGRATED CIRCUIT DIE AND METHOD OF FORMING THE DEVICE

FIELD OF THE INVENTION

The present invention relates to the field of integrated circuit devices, and more particularly, to integrated circuit packages with contact pads exposed on a bottom surface.

BACKGROUND OF THE INVENTION

Integrated circuit packages, such as a quad flat package (QFP), small outline integrated circuit (SOC) package and plastic single small outline (PSSO) package include a die pad and an integrated circuit (or die) that is supported on the surface of the die pad. An encapsulating material surrounds the integrated circuit. A plurality of pins, often called leads, such as "gull wing" leads, usually extend from the sides of the encapsulating material forming the package. The leads are connected by bond wires to the encapsulated integrated circuit. Often these types of integrated circuit devices are formed as surface mounted devices. The package form may be a flat rectangular body and often is a square body with leads extending along all four sides. There are numerous design variations, which differ usually in the number of leads, their pitch, the package dimensions, and the materials used to construct the package. Materials often are selected to improve or vary the thermal characteristics of the package.

Quad flat no leads (QFN) packages are similar in design, but have improved coplanarity and heat dissipation and do not have gull-wing leads that act as antennas. As a result, QFN packages create much less "noise" in high-frequency applications as compared to QFP and similar packages. The QFN package includes an integrated circuit die surrounded by an encapsulation material and leads coupled to the IC die and to contact pads exposed on a bottom surface of the encapsulation material adjacent its periphery. QFN packages are known for their small size, cost-effectiveness and good production yields. Because of an exposed lead frame pad (or top die paddle support), these QFN packages provide good thermal performance and remove heat from the package because of the direct thermal path from the exposed lead frame pad.

The contact pads exposed on the bottom surface of the encapsulation material in QFN and similar packages are usually single row pads and the die rests on top of the top die paddle support that cooperates with the lead frame pad. In those cases where the die is small relative to the top die paddle support, delamination may occur because the encapsulation material may separate from one or more of the leads when induced by temperature changes or mechanical stresses. Epoxy bleed-out may also occur when the IC die is initially adhered to the top die paddle support. Also, larger packages may occupy excessive space on the circuit board. It would be advantageous if the QFN package size can be reduced and different IC die sizes accommodated without compromising the die-to-die pad ratio while also reducing delamination and epoxy bleed-out.

SUMMARY OF THE INVENTION

An integrated circuit (IC) device comprises an IC die and encapsulation material surrounding the IC die. A first set of leads is coupled to the IC die and has first contact pads exposed on a bottom surface of the encapsulation material adjacent a periphery thereof. A second set of leads is coupled to the IC die and has second contact pads exposed on the bottom surface of the encapsulation material adjacent the periphery thereof. The second set of leads also has internal ends extending laterally inwardly from respective ones of the second contact pads to define a die pad area supporting the IC die thereon.

The first and second contact pads may be arranged in an alternating pattern. First and second contact pads may also be arranged in an offset pattern with the first contact pads arranged closer to the periphery on the bottom surface of the encapsulation material and the second contact pads. The first set of leads may have the same shape and size. Each lead of the second set of leads may comprise an encapsulated distal end extending laterally outwardly from a respective second contact pad.

In an embodiment, the lower surface of the encapsulation material has four sides defining a rectangular shape. The second set of leads may comprise a respective group of leads extending in parallel inwardly from each of the four sides of the lower surface of the encapsulation material. The second set of leads may have different lengths defining an X-shaped opening extending between corners of the rectangular shape. A first set of bond wires may couple the IC die and the first set of leads and a second set of bond wires may couple the IC die and the second set of leads.

A method of making an integrated circuit (IC) device includes coupling a first set of leads having first contact pads to an IC die. The method includes coupling a second set of leads having second contact pads to the IC die, the second set of leads also having internal ends extending laterally inwardly from respective ones of the second contact pads to define a die pad area supporting the IC die thereon. The method includes surrounding the IC die with an encapsulation material so that the first and second contact pads are exposed on the bottom surface of the encapsulation material adjacent a periphery thereof.

BRIEF DESCRIPTION OF THE DRAWINGS

FIGS. 7A-7G are fragmentary section views showing the sequence of fabrication steps to form an example of the IC device of FIGS. 3-6 in accordance with a non-limiting example.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
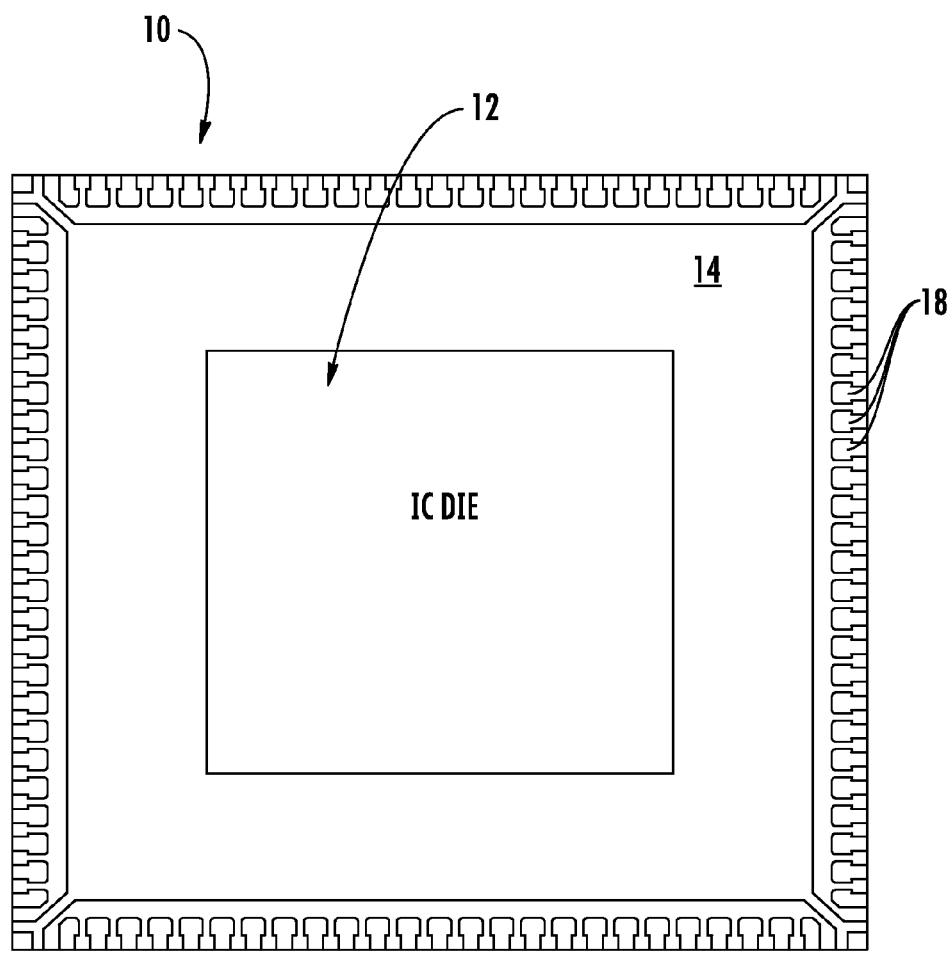
FIG. 1 is a fragmentary plan view of a prior art integrated circuit (IC) device formed as quad flat no-leads (QFN) package with a single row of contact pads.
Figure 2:
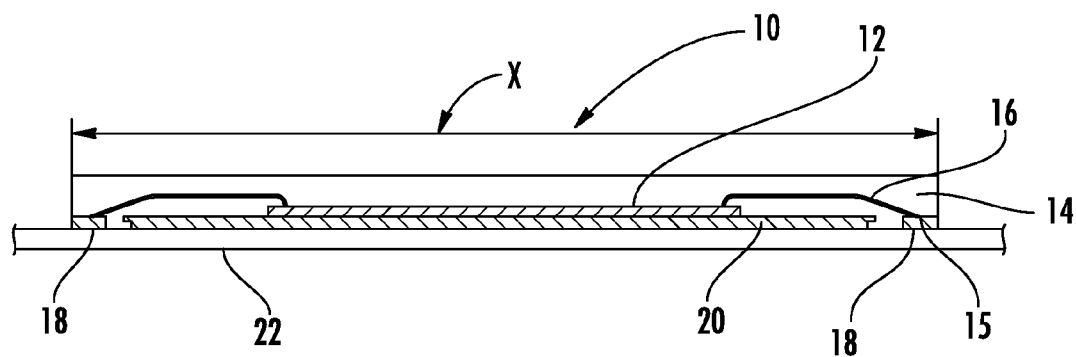
FIG. 2 is a sectional view of the prior art QFN package shown in FIG. 1.

FIGS. 1 and 2 are a schematic plan view and sectional view respectively of a prior art integrated circuit (IC) device 10 formed as a surface mounted IC package and in this example as a quad flat no-leads (QFN) package, which includes the IC die 12 and an encapsulation material 14 surrounding the IC die. As shown in the sectional view of FIG. 2, leads 15 are coupled to the IC die 12 by bond wires 16. The contact pads 18 are formed by the leads 15 and exposed on a bottom surface of the encapsulation material 14 adjacent its periphery. The IC die 12 is secured on a top die paddle support 20 using a die attach material, such as an adhesive epoxy. The top die paddle support 20 is exposed to facilitate a direct thermal path onto a circuit board 22 (FIG. 2) and remove heat from the package. The contact pads 18 are formed as a single row around the periphery as best illustrated in FIG. 1. In this example, the die is rectangular configured as a square and about 6×6 millimeters (mm) and the overall package forming the IC device 10 is rectangular configured as a square and about 11 mm on each side as shown by dimension X in FIG. 2. Each side of this rectangular configured prior art QFN package shown in FIG. 1 includes 25 contact pads 18 formed from the leads 15.

In this type of prior art package, heat and stresses may impart delamination near the die pad area. If the die is too small for the top die paddle support 20, epoxy bleed-out may occur after the IC die 12 is attached. Also, because a single row of leads is used, a larger package is required and thus occupies a larger space on the circuit board.

Figure 3:
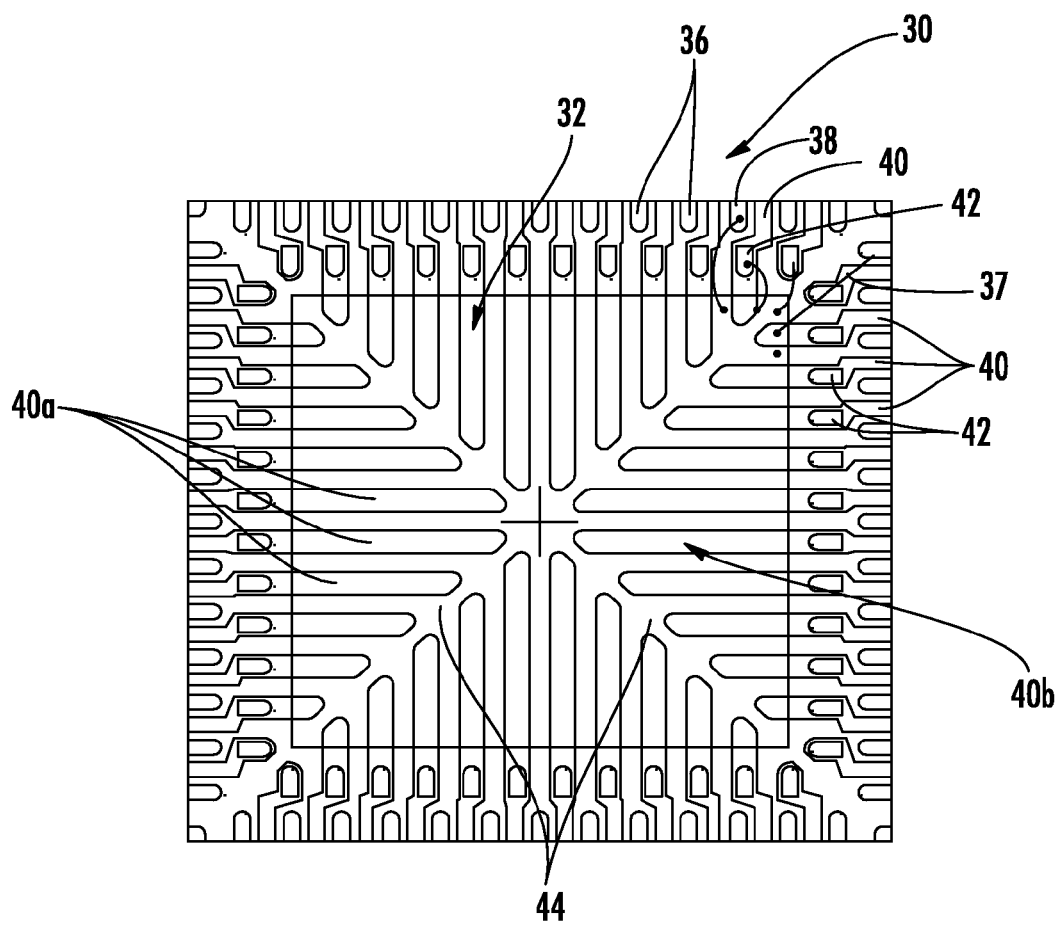
FIG. 3 is a schematic plan view of the IC device formed as a QFN package in accordance with a non-limiting example and showing a smaller package size, but the same size IC die and same number of contact pads as compared to the prior art package shown in FIG. 1.
Figure 4:
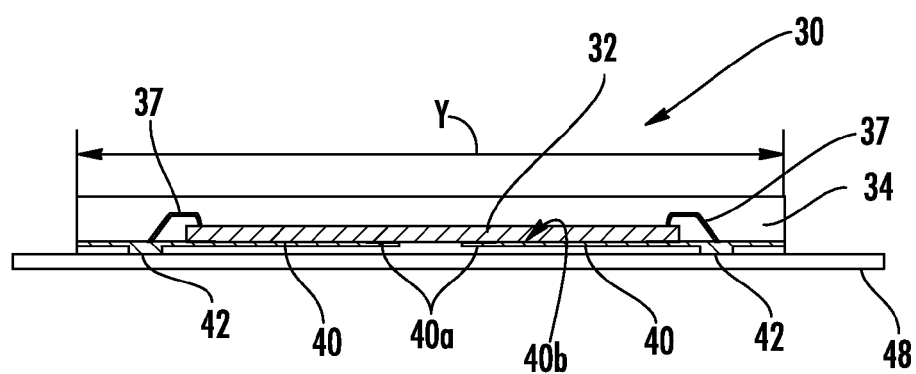
FIG. 4 is a sectional view of the package shown in FIG. 3 in accordance with a non-limiting example.

FIGS. 3 and 4 are a schematic top plan view and sectional view respectively of the IC device 30 in accordance with a non-limiting example in which the same size 6×6 mm IC die 32 as used in the prior art package of FIGS. 1 and 2 has a smaller package configuration of only 8.5 mm (dimension Y in FIG. 4), as compared to the 11 mm package shown in FIGS. 1 and 2. Both packages have the same lead count and 25 contact pads on each side. The package shown in FIGS. 3 and 4, however, is smaller at 8.5 mm on each side. As explained in greater detail below, the top die paddle support of the prior art package shown in FIGS. 1 and 2 is replaced with extended leads as described below, which support the IC die 32. This design will accommodate more IC die sizes as compared to the prior art packages of FIGS. 1 and 2 without compromising the die-to-die pad ratio while also reducing delamination and eliminating epoxy bleed-out since no top die paddle support is used.

The IC device 30 includes the IC die 32 that is the same size in this example as in the prior art package of FIG. 1 and an encapsulation material 34 (FIG. 2) surrounding the IC die 32. A first set of leads 36 is coupled to the IC die 32 via bond wires 37 and has first contact pads 38 exposed on a bottom surface of the encapsulation material 34 adjacent its periphery such as shown in the perspective view of FIG. 5 and plan view of FIG. 6. A second set of leads 40 is coupled to the IC die via bond wires 37 and has second contact pads 42 exposed on the bottom surface of the encapsulation material 34 adjacent its periphery. This second set of leads 40 also has internal ends 40a extending inwardly from respective ones of the second contact pads 42 to define a die pad area 40b supporting the IC die 32.

Figure 5:
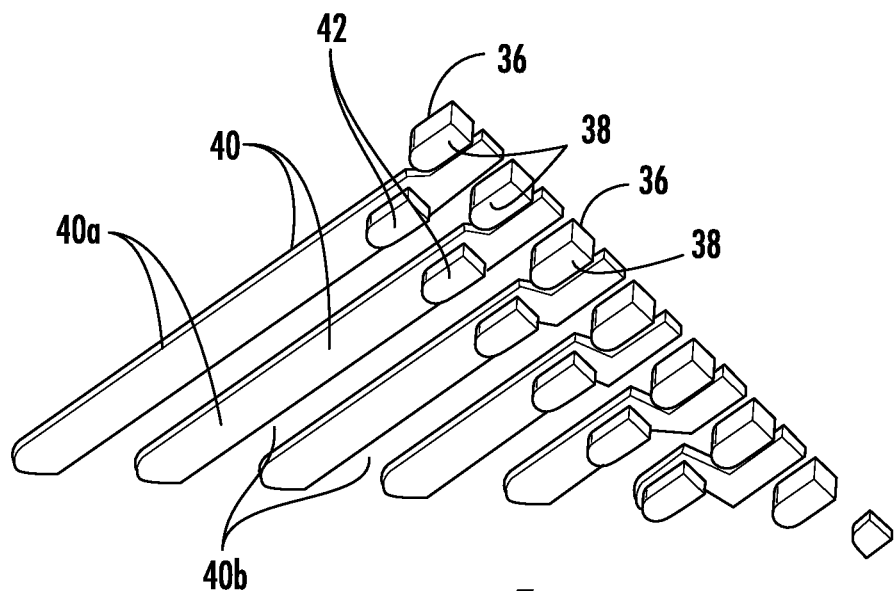
FIG. 5 is a fragmentary perspective view of the underside of the first and second set of leads and showing the second set of leads defining a die pad area to support the IC die in accordance with a non-limiting example.
Figure 6:
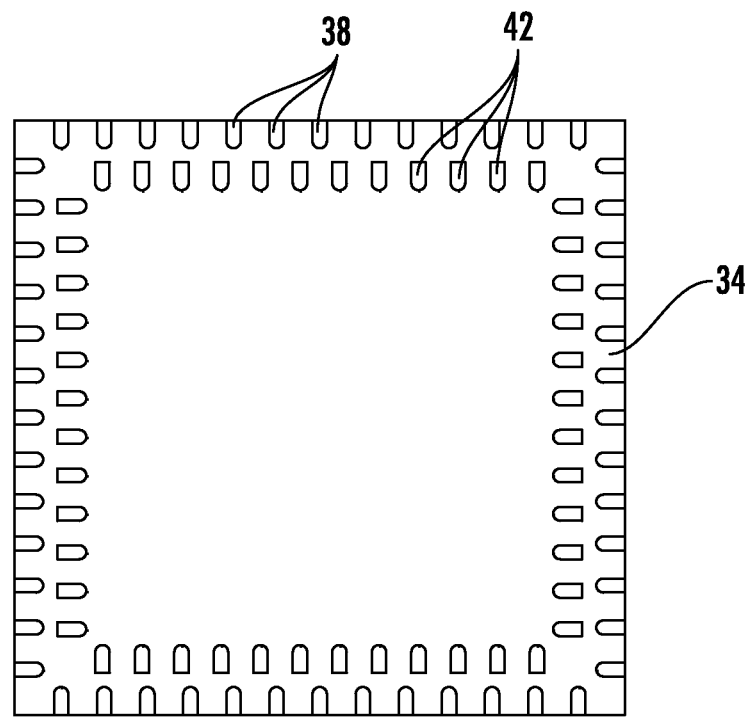
FIG. 6 is a bottom plan view showing an offset pattern of first and second contact pads in accordance with a non-limiting example.

The first and second contact pads 38, 42 may be arranged in an alternating pattern in one example. They may also be arranged in an offset pattern with the first contact pads being arranged closer to the periphery of the bottom surface of the encapsulation material 34 and the second contact pads. The first set of leads 36 may have the same shape and size. This configuration is best shown in the fragmentary, perspective view of FIG. 5 showing a portion of the first and second set of leads 36, 40 in FIG. 3 and looking from the underside.

The second set of leads 40 has an encapsulated distal end extending laterally outwardly from a respective second contact pad 42. As shown in the example of FIG. 3, the encapsulation material 34 has four sides defining a rectangular shape. The second set of leads 40 includes a respective group of leads extending in parallel and inwardly from each of the four sides of the lower surface of the encapsulation material 34 in an example. This second set of leads 40 may have different lengths defining an X-shaped opening 44 extending between corners of the rectangular shape (FIG. 3). A first set of bond wires 37 couples the IC die 32 and the first set of leads and a second set of bond wires 37 couples the IC die and the second set of leads 40. The IC device 30 is shown in FIG. 4 on the circuit board 48.

FIGS. 7A-7G show a sequence of steps for manufacturing an IC device 50 (FIG. 7G) in accordance with a non-limiting example that is similar to the IC device 30 shown in FIGS. 3-6.

FIG. 7A shows a lead frame strip 52 that will later be cut to form the various leads 53 in the final IC device 50. This lead frame strip 52 is supported on a tape 54. FIG. 7B shows the IC die 56 attached to the lead frame strip 52 and adhered by an epoxy or other adhesive. FIG. 7C shows the wire bonding of the bond wires 57 from the IC die 56 to the leads 53 at a location where the respective contact pads 58 will be formed. FIG. 7D shows the mold encapsulation where the encapsulation material 60 is molded to surround the IC die 56.

In FIG. 7E, the tape 54 is removed to expose the contact pads 58 from the encapsulation material 60. In FIG. 7F, the encapsulation material 60 is laser marked for chip identifiers 62. In FIG. 7G, the encapsulation material 60 is cut to form the final IC device 50 with the exposed contact pads 58 and a set of leads 53 supporting the IC die 56.

The final IC device, in accordance with a non-limiting example, has the same lead count and same die size as the prior art IC device 10 shown in FIG. 1, but with multi-row leads and contact pads and allows a smaller footprint on a circuit board. It has reduced delamination and no epoxy bleed-out.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An integrated circuit (IC) device comprising:
   an IC die;
   encapsulation material surrounding said IC die;
   a first set of leads, coupled to said IC die, and having first contact pads exposed on a bottom surface of said encapsulation material adjacent a periphery thereof; and
   a second set of leads, coupled to said IC die, and having second contact pads exposed on the bottom surface of said encapsulation material adjacent the periphery thereof;

said second set of leads also having internal ends extending laterally inwardly from respective ones of said second contact pads to define a die pad area supporting said IC die thereon, wherein the bottom surface of the encapsulation material has four sides defining a rectangular shape and the second set of leads includes respective groups of leads having different lengths extending in parallel and inwardly from each of the four sides to define an X-shaped opening between corners of the rectangular shape.

2. The IC device of claim 1 wherein said first and second contact pads are arranged in an alternating pattern.

3. The IC device of claim 1 wherein said first and second contact pads are arranged in an offset pattern with said first contact pads being arranged closer to the periphery of the bottom surface of said encapsulation material than said second contact pads.

4. The IC device of claim 1 wherein said first set of leads have a same shape and size.

5. The IC device of claim 1 wherein each lead of said second set of leads comprises an encapsulated distal end extending laterally outwardly from a respective second contact pad.

6. The IC device of claim 1 further comprising:
a first set of bond wires coupling said IC die and said first set of leads; and
a second set of bond wires coupling said IC die and said second set of leads.

7. An integrated circuit (IC) device comprising:
an IC die;
encapsulation material surrounding said IC die;
a first set of leads, coupled to said IC die, and having first contact pads exposed on a bottom surface of said encapsulation material adjacent a periphery thereof, said first set of leads having a same shape and size; and
a second set of leads, coupled to said IC die, and having second contact pads exposed on the bottom surface of said encapsulation material adjacent the periphery thereof;
said second set of leads also having internal ends extending laterally inwardly from respective ones of said second contact pads to define a die pad area supporting said IC die thereon, each lead of said second set of leads comprising an encapsulated distal end extending laterally outwardly from a respective second contact pad, wherein the bottom surface of the encapsulation material has four sides defining a rectangular shape and the second set of leads includes respective groups of leads having different lengths extending in parallel and inwardly from each of the four sides to define an X-shaped opening between corners of the rectangular shape.

8. The IC device of claim 7 wherein said first and second contact pads are arranged in an alternating pattern.

9. The IC device of claim 7 wherein said first and second contact pads are arranged in an offset pattern with said first contact pads being arranged closer to the periphery of the bottom surface of said encapsulation material than said second contact pads.

10. The IC device of claim 7 further comprising:
a first set of bond wires coupling said IC die and said first set of leads; and
a second set of bond wires coupling said IC die and said second set of leads.

11. A method for making an integrated circuit (IC) device comprising:
coupling a first set of leads having first contact pads to an IC die;
coupling a second set of leads having second contact pads to the IC die, the second set of leads also having internal ends extending laterally inwardly from respective ones of the second contact pads to define a die pad area supporting the IC die thereon; and
surrounding the IC die with an encapsulation material so that the first and second contact pads are exposed on a bottom surface of the encapsulation material adjacent a periphery thereof, wherein the bottom surface of the encapsulation material has four sides defining a rectangular shape and the second set of leads includes respective groups of leads having different lengths extending in parallel and inwardly from each of the four sides to define an X-shaped opening between corners of the rectangular shape.

12. The method of claim 11 wherein the first and second contact pads are arranged in an alternating pattern.

13. The method of claim 11 wherein the first and second contact pads are arranged in an offset pattern with the first contact pads being arranged closer to the periphery of the bottom surface of the encapsulation material than the second contact pads.

14. The method of claim 11 wherein the first set of leads have a same shape and size.

15. The method of claim 11 wherein each lead of the second set of leads comprises an encapsulated distal end extending laterally outwardly from a respective second contact pad.

* * * * *